(12) United States Patent
Schicktanz

(10) Patent No.: US 8,981,416 B2
(45) Date of Patent: Mar. 17, 2015

(54) ORGANIC LIGHT-EMITTING DIODE, CONNECTOR AND LUMINAIRE

(71) Applicant: OSRAM Opto Semiconductors GmbH, Regensburg (DE)

(72) Inventor: Simon Schicktanz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/370,145

(22) PCT Filed: Dec. 3, 2012

(86) PCT No.: PCT/EP2012/074257
§ 371 (c)(1),
(2) Date: Jul. 1, 2014

(87) PCT Pub. No.: WO2013/102523
PCT Pub. Date: Jul. 11, 2013

(65) Prior Publication Data
US 2014/0367666 A1    Dec. 18, 2014

(30) Foreign Application Priority Data
Jan. 2, 2012    (DE) .................. 10 2012 200 023

(51) Int. Cl.
*H01L 33/00* (2010.01)
*F21V 9/00* (2006.01)
(Continued)

(52) U.S. Cl.
CPC ............ *H01L 33/62* (2013.01); *H01L 51/5271* (2013.01); *H01L 2251/5361* (2013.01); *H01L 2224/49* (2013.01); *H01L 2224/484* (2013.01); *H01L 2224/4826* (2013.01)

USPC .................. 257/98; 257/40; 257/79; 257/99; 257/676; 257/E33.056; 257/E33.057; 257/E33.063; 257/E33.064; 315/118; 362/133; 362/231; 362/235

(58) Field of Classification Search
CPC ............... H01L 33/62; H01L 51/5271; H01L 2251/5361; H01L 2224/49; H01L 2224/484; H01L 2224/4826
USPC .................. 257/40, 79, 98, 99, 676, E33.056, 257/E33.057, E33.063, E33.064; 315/118; 362/133, 231, 235
See application file for complete search history.

(56) References Cited

U.S. PATENT DOCUMENTS 7,102,172 B2 * 9/2006 Lynch et al. ................ 257/79
8,283,868 B2 * 10/2012 Lee et al. .................... 315/118
(Continued)

FOREIGN PATENT DOCUMENTS

DE           10324787        2/2004
DE         102008027519     12/2009
(Continued)

*Primary Examiner* — Dao H Nguyen
(74) *Attorney, Agent, or Firm* — DLA Piper LLP (US)

(57) ABSTRACT

An organic light-emitting diode has a carrier substrate. The light-emitting diode also contains an active layer that generates and emits electromagnetic radiation at a carrier front face. The active layer is mounted on the carrier substrate. At least one contacting device is located on a carrier rear face and is arranged simultaneously for electrical contacting and for mechanical attachment of the light-emitting diode. The contacting device includes a contact region. The contact region and/or the contacting device, seen in a side view parallel to the carrier rear face, are elevated in a U-shape or L-shape above the carrier rear face and/or extend in a lateral direction away from the active layer.

12 Claims, 4 Drawing Sheets

(51) Int. Cl.
*H01J 13/32* (2006.01)
*H01L 33/62* (2010.01)
*H01L 51/52* (2006.01)

(56) References Cited

U.S. PATENT DOCUMENTS

| | | | |
|---|---|---|---|
| 8,652,860 B2 * | 2/2014 | West et al. | 438/22 |
| 8,746,922 B2 * | 6/2014 | Harbers et al. | 362/231 |
| 8,864,511 B2 * | 10/2014 | Shimizu et al. | 439/226 |
| 2007/0108460 A1 * | 5/2007 | Lee et al. | 257/98 |
| 2008/0142816 A1 * | 6/2008 | Bierhuizen et al. | 257/82 |
| 2010/0142202 A1 * | 6/2010 | Sugishita et al. | 362/235 |
| 2010/0321937 A1 | 12/2010 | Van Bommel et al. | |
| 2011/0116275 A1 | 5/2011 | Sheek | |

FOREIGN PATENT DOCUMENTS

| | | |
|---|---|---|
| DE | 102011003418 | 9/2011 |
| DE | 102010014473 | 10/2011 |
| DE | 102010014611 | 10/2011 |
| DE | 202010004807 | 11/2011 |

* cited by examiner

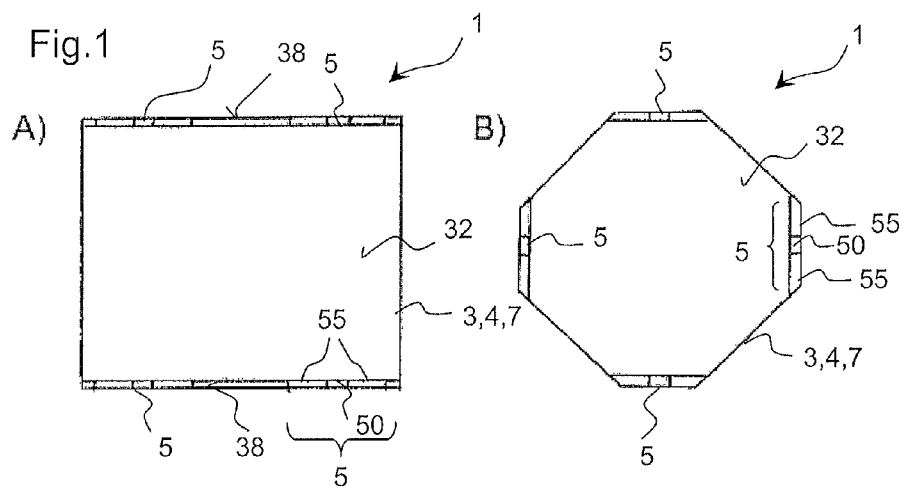
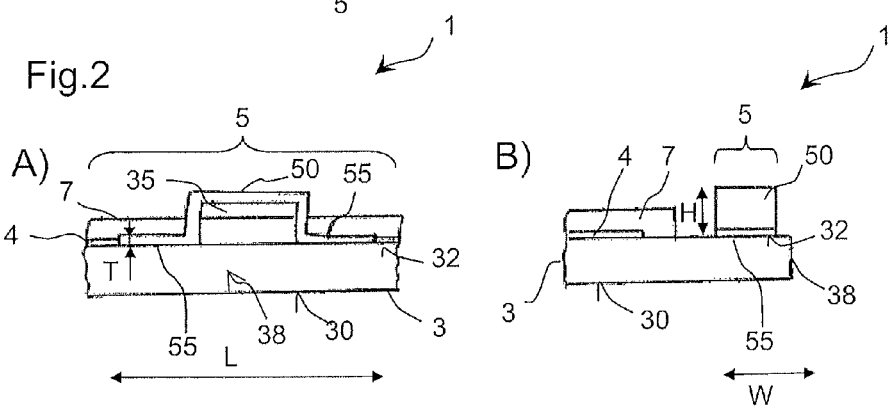
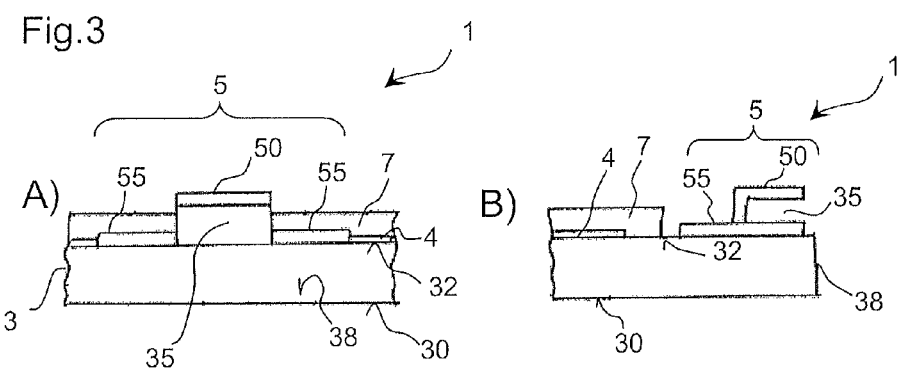

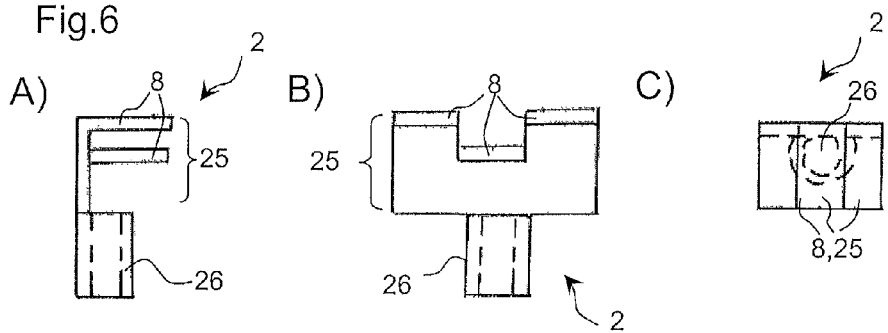
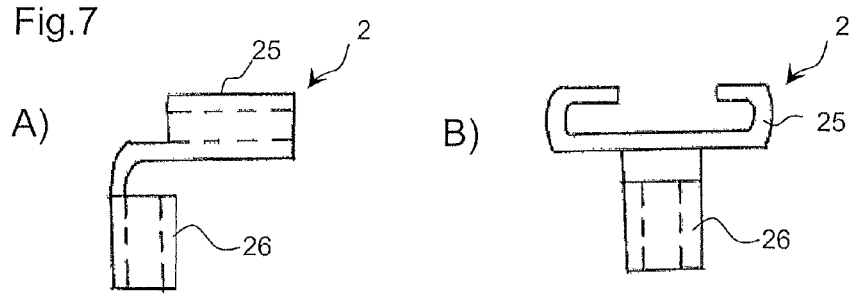
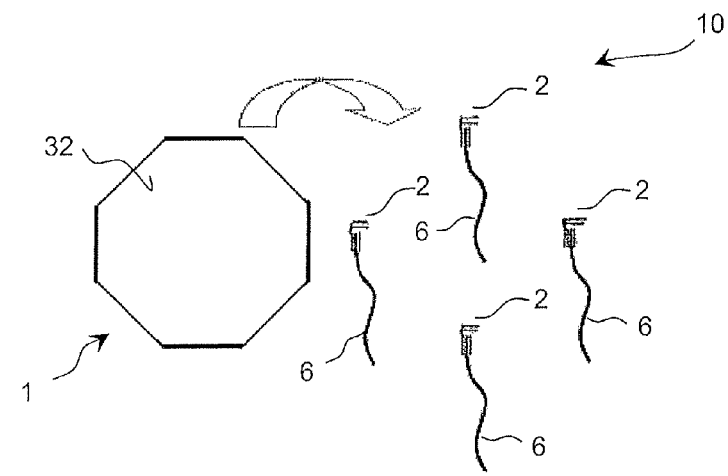

ORGANIC LIGHT-EMITTING DIODE, CONNECTOR AND LUMINAIRE

TECHNICAL FIELD

This disclosure relates to an organic light-emitting diode, a connector for a light-emitting diode and a luminaire having an organic light-emitting diode.

BACKGROUND

There is a need to provide an organic light-emitting diode that is efficiently electrically and mechanically contactable.

SUMMARY

I provide a luminaire comprising at least one organic light-emitting diode and a plurality of connectors, wherein the organic light-emitting diode includes a carrier substrate a carrier front face and having a carrier rear face, at least one active layer that generates electromagnetic radiation and emits the radiation at the carrier front face, the active layer being mounted on the carrier substrate, a reflective layer located on a side of the active layer remote from the carrier substrate, at least one contacting device on the carrier rear face that electrically contacts and simultaneously mechanically attaches the organic light-emitting diode, the contacting device comprises a contact region and, seen in a side view parallel to the carrier rear face, is elevated in a U-shape or L-shape above the carrier rear face and/or extends in a lateral direction away from the active layer; wherein the connector includes at least one clamping device that clamps the contact region of the contacting device of the organic light-emitting diode, and at least one cable connection region that mounts an electrically conductive cable on the connector; wherein: the light-emitting diode is electrically contacted and mechanically attached only by the connectors, the connectors are not visible in plan view onto the carrier front face, the contacting device, seen in plan view onto the carrier front face, is entirely covered by the carrier substrate and is not visible from the carrier front face, and the contacting device, at least in some locations seen from the carrier rear face, covers the active layer so that the active layer is located in some locations between the contacting device and the carrier substrate.

I also provide a luminaire comprising at least one organic light-emitting diode and a plurality of connectors, wherein the organic light-emitting diode comprises: a carrier substrate having a carrier front face and having a carrier rear face, at least one active layer that generates electromagnetic radiation and emits the radiation at the carrier front face, the active layer being mounted on the carrier substrate, at least one contacting device on the carrier rear face that electrically contacts and simultaneously mechanically attaches the organic light-emitting diode, the contacting device comprising a contact region and, seen in a side view parallel to the carrier rear face, is elevated in a U-shape or L-shape above the carrier rear face and/or extends in a lateral direction away from the active layer; wherein the connector comprises: at least one clamping device that clamps the contact region of the contacting device of the organic light-emitting diode, and at least one cable connection region that mounts an electrically conductive cable on the connector; wherein the light-emitting diode is electrically contacted and mechanically attached by the connectors.

BRIEF DESCRIPTION OF THE DRAWINGS

FIGS. 1A, 1B, 1C, 2A, 2B, 3A and 3B show diagrammatic views of examples of organic light-emitting diodes described herein.

FIGS. 4A, 4B, 5A, 5B, 5C, 6A, 6B, 6C, 7A and 7B show diagrammatic views of examples of connectors described herein.

FIGS. 8 to 10 show diagrammatic views of examples of luminaires described herein.

DETAILED DESCRIPTION

Figure 4:
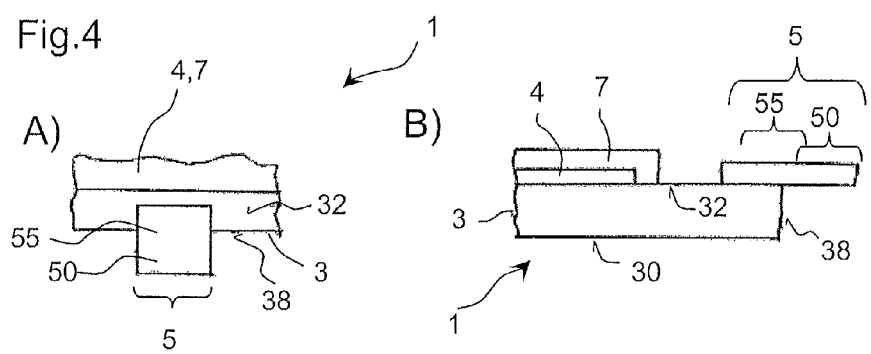

My organic light-emitting diode may comprise a carrier substrate. The carrier substrate has a carrier front face and, opposite thereto, a carrier rear face. The carrier substrate is preferably the component that mechanically stabilizes and mechanically supports the organic light-emitting diode. The carrier substrate is preferably permeable to radiation generated during operation of the light-emitting diode. The carrier substrate can be a transparent or opaque plate or film composed of a glass or of a plastics material. The carrier substrate can equally be a metal plate or a metal foil or can be made from a ceramic material or from a semiconductor material such as silicon.

The light-emitting diode may contain one or more active layers. The active layer is arranged to generate electromagnetic radiation during operation of the light-emitting diode. The active layer is formed from one or more organic materials. The active layer can be part of an organic layer stack which, in addition to the active layer, also has further layers based on organic materials such as charge carrier injection layers and/or charge carrier barrier layers. During operation of the light-emitting diode, at least some visible radiation is generated in the active layer.

The active layer may be mounted at least indirectly on the carrier substrate. For example, a transparent electrode, for example, composed of a transparent conductive oxide such as indium tin oxide, is mounted on the carrier substrate, especially on the carrier rear face, in which case the organic layer stack having the active layer is preferably mounted directly on the electrode.

The light-emitting diode may be arranged so that the radiation generated in the active layer is emitted at the carrier front face. For example, a reflective layer, preferably a metal mirror, is located on a side of the active layer and/or of the organic layer stack remote from the carrier substrate. The metal mirror can serve as a second electrode for the active layer and/or the organic layer stack.

The light-emitting diode may comprise one or more contacting devices. The at least one contacting device is arranged to electronically contact and simultaneously mechanically attach the component. In other words, the organic light-emitting diode is arranged to be supplied with power by the contacting device. Furthermore, by the contacting device it is preferably possible to fix a spatial position of the organic light-emitting diode. In particular, apart from the at least one contacting device, the organic light-emitting diode has no further components that serve for electrical and/or mechanical contacting and/or attachment. It is possible, solely by way of the at least one contacting device, for the organic light-emitting diode to be in electrically conductive contact and, likewise, solely by way of the at least one contacting device, in mechanically fixed contact with an environment.

The at least one contacting device may be mounted on the carrier rear face. For example, the contacting device is indirectly or directly mounted on the carrier substrate or on a coating of the carrier substrate by adhesive bonding, soldering or welding. Preferably, the contacting device is irreversibly mounted on the carrier substrate so that the contacting device cannot be removed from the carrier substrate without requiring further measures such as fresh adhesive bonding or soldering, for reattachment.

The contacting device may comprise a contact region. The contact region is arranged to be electrically contacted. Furthermore, the contact region has sufficient mechanical stability to be able to attach and/or support the organic light-emitting diode.

The contact region of the contacting device may be elevated above the carrier rear face. In other words, some or all of the contact region extends away from the carrier rear face. It is possible for some or all of the contact region to run parallel to and spaced apart from the carrier rear face.

The contact region and/or the contacting device may extend in a lateral direction away from the active layer. The contact region can be located substantially in the same plane as the active layer or, at least in some regions, in a plane parallel to the active layer and/or to the carrier rear face.

The contacting device and/or the contact region may be U-shaped or L-shaped. In a side view parallel to the carrier rear face and/or in a side view onto a carrier end face, the contacting device and/or the contact region therefore have a U-like or L-like shape. U-shaped does not mean that the contact region and/or the contacting device cannot have an angular shape, seen in a side view. Similarly, the term L-shaped does not mean that, seen in a side view, the contacting device and/or the contact region cannot have a rounded shape in a region in which the two arms of the L abut one another.

The organic light-emitting diode may have a carrier substrate having a carrier front face and a carrier rear face. Furthermore, the light-emitting diode contains at least one active layer that generates electromagnetic radiation and emits the radiation at the carrier front face. The active layer is mounted on the carrier substrate. At least one contacting device of the light-emitting diode is located on the carrier rear face and is arranged simultaneously for electrical contact and mechanical attachment of the light-emitting diode. The contacting device comprises a contact region. The contact region and/or the contacting device, seen in a side view parallel to the carrier rear face, are elevated in a U-shape or L-shape above the carrier rear face and/or extend in a lateral direction away from the active layer.

A contacting device of such a shape makes it possible to realize efficient, simultaneous electrical and mechanical contacting of the organic light-emitting diode.

The contact region or the entire contacting device, seen in plan view onto the carrier front face, may be located next to the active layer. In other words, the active layer then does not cover the contact region and/or the contacting device and vice versa. As an alternative thereto it is equally possible for the contacting device and the contact region each to cover the active layer, at least in some locations, seen from the carrier rear face. The active layer is in that case located, at least in some locations, between the contacting device and the carrier substrate.

The contact region may be formed mirror-symmetrically with respect to a plane perpendicular to the carrier rear face. The contact region can also have two planes of symmetry arranged orthogonally to one another and each oriented perpendicular to the carrier rear face. At least one of the planes of symmetry then preferably also runs perpendicular to a carrier end face nearest to the contact region.

An intermediate space may be located between the contact region and the carrier rear face. The intermediate space is preferably filled with a gas such as air. In a lateral direction, that is to say along a direction parallel to the carrier rear face, the intermediate space is preferably not fully enclosed by the contact region and/or the contacting device. In particular, the intermediate space is freely accessible from the nearest carrier end face and is not blocked by further components of the organic light-emitting diode. Alternatively or in addition, the intermediate space can be freely accessible from a side remote from the nearest carrier end face and/or also from directions oriented parallel to the carrier end face.

The contacting device and the contact region may be made from a metal strip and/or a printed circuit board. The printed circuit board can be a flexible printed circuit board. The contacting device and the contact region are in that case preferably formed by bending and/or stamping the metal strip or the printed circuit board. In particular it is possible for the contacting device to consist of a metal strip or of a printed circuit board.

The contacting device, seen in plan view onto the carrier front face, may be entirely covered by the carrier substrate. The contacting device therefore then does not project beyond the carrier substrate in a lateral direction.

The contacting device, especially the contact region and preferably exclusively the contact region, may project beyond the carrier substrate in a lateral direction. It is then possible for the contact region to be freely accessible from the carrier front face.

The contacting device and/or the contact region need not be visible from the carrier front face. In other words, seen in plan view onto the carrier front face, the contacting device is not visible to an observer of the light-emitting diode. For example, a mirror that reflects radiation generated in the active layer is located between the carrier substrate and the contacting device.

The at least one contacting device may be mounted along one or more of the carrier end faces at an edge of the carrier rear face. It is possible for the edge, seen in plan view onto the carrier substrate, to be free of the active layer. The carrier substrate then projects beyond the active layer. Such an edge free of the active layer can encircle the carrier rear face or it can be limited to individual sub-regions along the carrier end faces. For example, such an edge is present solely on two opposite sides of the carrier rear face.

The contacting device may have just one electrical contact pole. The contact pole is especially implemented by the contact region. In other words, the contacting device is then not a multi-pole plug or a multi-pole plug connection. For example, in that case, only an anode contact or only a cathode contact is made by the contacting device. Preferably the light-emitting diode then has exclusively contacting devices which each form just one electrical contact pole.

A length of the contacting device, along a direction parallel to the nearest carrier end face, may be at least 10 mm or at least 20 mm. Alternatively or in addition, the length is at most 60 mm or at most 300 mm.

The width of the contacting device, in a direction perpendicular to a nearest carrier end face, may be at least 2 mm or at least 5 mm or at least 10 mm or at least 15 mm. Alternatively or in addition, the width is at most 35 mm or at most 30 mm or at most 25 mm. It is possible for the width to be a mean width. It is therefore not necessary for the width of the contacting device to remain constant over its entire length.

The contacting device may have a maximum height in a direction perpendicular to the carrier rear face of at least 0.5 mm or of at least 1.0 mm or of at least 2.0 mm. Alternatively or in addition, the maximum height is then at most 10 mm or at most 6 mm or at most 4 mm.

The thickness of a material from which the contacting device and/or the contact region are formed may be 0.2 mm to 2.0 mm or 0.4 mm to 2.0 mm or 0.5 mm to 1.0 mm. For example, the contacting device is made from a sheet metal or a printed circuit board composed of a Kapton tape having a copper coating.

The light-emitting diode may have one of the following numbers of contacting devices: 1, 2, 3, 4, 5, 6, 8, 10. The contacting devices can all be of identical construction. It is equally possible for the light-emitting diode to have differently shaped contacting devices and/or differently shaped contact regions.

Furthermore, a connector is defined. The connector can be used to contact an organic light-emitting diode as described in one or more of the above-mentioned examples. Features of the connector are therefore also disclosed for the organic light-emitting diode and vice versa.

The connector may have one or more clamping devices. The clamping device is arranged to clamp the contact region of the contacting device of the organic light-emitting diode. For example, for this purpose, the clamping device has resilient properties. The clamping device is arranged so that the organic light-emitting diode is simultaneously mechanically attachable and electrically contactable by the contacting device.

The connector may have one or more cable connection regions. The cable connection regions are arranged so that an electrically conductive cable can be mounted on the connector. The cable connection regions can have a sleeve-like shape. If a plurality of clamping devices and a plurality of cable connection regions are present, they are preferably assigned to one another one-to-one.

Electrical contact of the light-emitting diode may be effected exclusively by the connector. In other words, current then flows from and to the organic light-emitting diode exclusively by way of a sub-region of the connector and not directly from an environment.

The clamping device may be arranged to be plugged onto the contact region of the contacting device. The clamping device and the contact region can be shaped to fit one another exactly. The clamping device can on two or more sides rest directly on the contact region and can touch the contact region on two or more sides.

A receiving direction of the cable connection region for a cable may be oriented transversely with respect to a plug-in direction of the clamping device. Preferably, the receiving and plug-in directions are perpendicular or approximately perpendicular to one another. The plug-in direction is that direction along which the connector has to be moved to mount the clamping device on the contact region in the intended manner. The receiving direction is a direction from which a cable passes into the connector in the intended manner, without being subjected to bending or excessive bending.

The connector may be a one-piece metal part. Preferably the connector is then formed from a metal sheet by stamping and bending. The connector is in that case not formed by the subsequent joining together of a plurality of separately manufactured workpieces, for example, by soldering or adhesive bonding or welding.

The clamping device may have a fork-like shape. The clamping device in that case has at least three or just three prongs. The prongs preferably point in the same direction and are especially aligned parallel or approximately parallel to one another.

The prongs of the clamping device may not lie in one plane. In other words, the prongs in that case preferably have at least two different spacings from the carrier rear face and/or from the cable connection region.

The prongs may be arranged to touch the contact region of the clamping device on at least two mutually opposite sides. The contact region is preferably clamped between the prongs.

The clamping device may be mounted to be tiltable and/or displaceable relative to the cable connection region. In other words, in that case, the clamping device is able to move relative to the cable connection region without the connector being destroyed. In particular, the clamping device is able to move when the organic light-emitting diode is mounted on the connector. As a result, it is possible to achieve simpler attachment of the organic light-emitting diode to the connector.

The clamping device and the connection region may be of one-piece construction. For example, the clamping device and the cable connection region are formed from a single piece of metal, especially by bending and stamping. So that the clamping device is able to move relative to the cable connection region, the connector can, in some locations, be enclosed by a housing body. One possible way of attaching the connector to an external object not belonging to the connector can be effected by attachment devices in the housing body, for example, in the form of holes for screws. If such a housing body is present, it is preferably irreversibly joined to the cable connection region in normal use.

The clamping device may be reversibly movable. Preferably, the organic light-emitting diode is in that case be attachable to the clamping device and releasable therefrom again without the clamping device being destroyed.

Furthermore, I provide a luminaire. The luminaire comprises at least one organic light-emitting diode and a plurality of connectors, as defined in connection with one or more of the above-mentioned examples. Features of the luminaire are, therefore, also disclosed for the connector and the organic light-emitting diode and vice versa.

In the luminaire, the organic light-emitting diode is electrically contacted and simultaneously mechanically attached by the connectors.

The luminaire may have connectors each of identical construction.

The connectors may be differently spatially oriented and aligned with respect to one another. In other words, in that case the connectors cannot be brought into register one above the other only by parallel displacement. For example, the connectors can be brought into register one above the other only by parallel displacement and rotation.

The organic light-emitting diode may be fixedly attached by the connectors to a wall or to a ceiling or to an external holder. The attachment is preferably such that the luminaire is unable to move in normal use.

The organic light-emitting diode may be attached by the connectors, for example, to a cable to be free-hanging. For example, the luminaire can then be suspended from the ceiling of a room.

An organic light-emitting diode described herein, a connector described herein and a luminaire described herein will be explained in detail below on the basis of examples and with reference to the drawings. In the individual Figures, elements that are identical are denoted by identical reference numerals, but are not shown to scale. Rather, the size of individual elements may have been shown exaggerated for the purpose of better understanding.

FIGS. 1A and 1B show diagrammatic plan views of examples of organic light-emitting diodes 1. The light-emitting diodes 1 each comprise a carrier substrate 3 on which an organic active layer 4 is mounted. The active layer 4 is in each case located between the carrier substrate 3 and a cover 7 as also FIG. 2. The cover 7 can be formed by a glass plate.

On a carrier rear face 32, a plurality of contacting devices 5 are in each case mounted in edge regions along carrier end faces 38. The contacting devices 5 are arranged for electrical contacting and mechanical attachment of the light-emitting diodes 1.

According to FIG. 1A, the light-emitting diode 1 has four contacting devices 5, of which two in each case are located on mutually opposing end faces 38 and two in each case are located opposite one another. The light-emitting diode 1 in accordance with FIG. 1A has a rectangular outline. In the light-emitting diode 1 according to FIG. 1B, the contacting devices 5 are mounted on four different carrier end faces 38. Seen in plan view onto the carrier rear face 32, the light-emitting diode 1 has an octagonal base surface.

FIGS. 2 to 4 each show the contacting devices 5 for the light-emitting diodes 1 in greater detail.

FIG. 2A is a diagrammatic front view and FIG. 2B is a diagrammatic side view of an example of the contacting device 5. The contacting device 5 has a contact region 50 and two edge regions 55 each located laterally next to the contact region 50. The contacting device 5, seen in front view, is U-shaped and extends in a direction away from the carrier rear face 32. Seen in side view in FIG. 2B, the contacting device 5 is rectangular in shape. The contact region 50 is a portion of the contacting device 5 spaced apart from the carrier rear face 32 and runs parallel to the carrier rear face 32.

A length L of the contacting device 5 along the carrier end face 38 is, for example, about 30 mm. A width W, in a direction perpendicular to the carrier end face 38, is approximately 5 mm. A maximum height H of the contacting device 5, in a direction perpendicular to the carrier rear face 32, is approximately 3 mm. A mean thickness T of a material of the contacting device 5 is approximately 0.8 mm.

The contact region 50 projects above the cover 7 in a direction away from the carrier rear face 32. An intermediate space 35 is located between the carrier substrate 3 and the contact region 50. The intermediate space 35 is freely accessible from the carrier end face 38 and also from an opposing side.

A reflective layer can be located between the active layer 4 and the cover 7 so that the light-emitting diode 1 emits radiation substantially only by way of the carrier front face 30. Unlike what is shown in the Figures, a reflective layer is preferably also located between the carrier substrate 3 and the contacting device 5 so that the entire contacting device 5 is not visible from the carrier front face 30.

Unlike what is shown and as also possible in all other examples, the contact region 50 and the contacting device 5 can terminate flush with the carrier end face 38. The contacting device 5 can, unlike what is shown, contain a plurality of contact regions 50.

The contacting device 5 is in the two edge regions 55 irreversibly attached to the carrier substrate 3. Such attachment can be effected by adhesive bonding, soldering, welding and/or ultrasound bonding. A corresponding coating can be applied to the carrier rear face 32 in the regions of the edge regions 55.

A further example of the contacting device 5 is shown in a front view in FIG. 3A and in a side view in FIG. 3B. The contacting device 5 has an L-shaped contact region 50 extending away from the carrier 3 and the active layer 4. The contact region 50 projects above the active layer 4 and the cover 7.

It is possible for the contacting device 5 to have an edge region 55 which adjoins the contact region 50 in a direction away from the carrier end face 38. In the example in accordance with FIG. 3, the intermediate space 35 is freely accessible both from the side and from the end face 38.

FIG. 4A is a plan view and FIG. 4B is a side view of a further example of the contacting device 5. According to FIG. 4, the contacting device 5 has a plate-like shape. Both the edge region 55 and the contact region 50 run substantially in the same plane as the active layer 4. Unlike what is shown in FIGS. 2 and 3, the contact region 50 projects beyond the carrier substrate 3 at the carrier end face 38. Unlike what is shown in FIG. 4A, it is possible for the edge regions 55 to have a greater lateral extent along the carrier end face 38 than the contact region 50.

Figure 5:
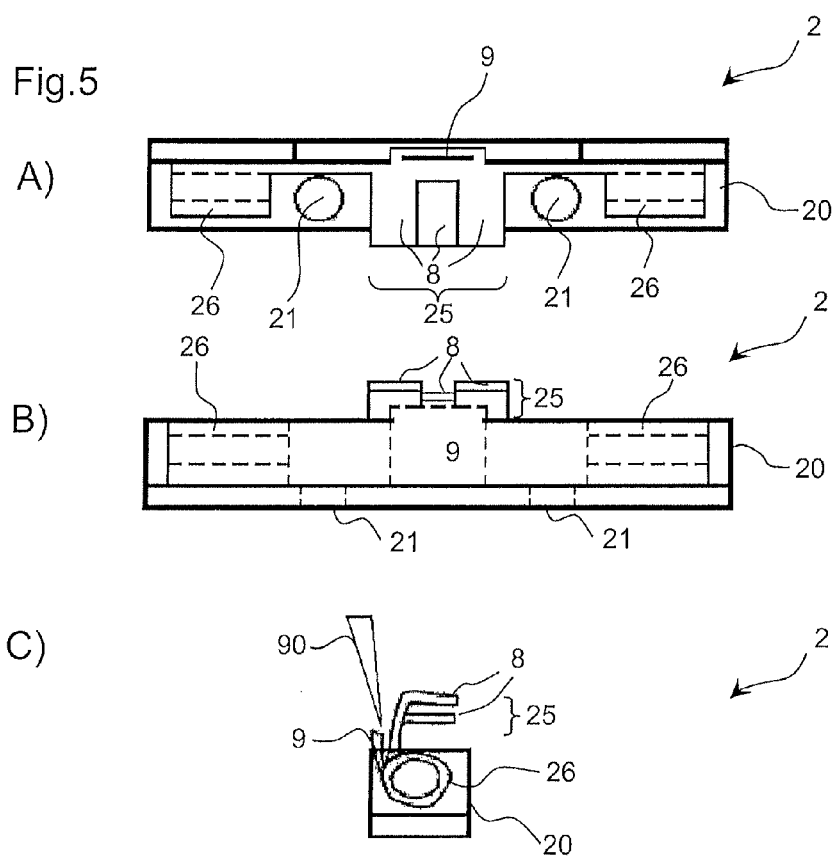

A connector 2 for electrical and mechanical contacting of the light-emitting diode 1 is shown in FIG. 5 as shown in the plan view in accordance with FIG. 5A, the front view in accordance with FIG. 5B and the side view in accordance with FIG. 5C. The different views are each shown only in a diagrammatic and simplified form.

The connector 2 according to FIG. 5 has a housing body 20. The housing body 20 has been shaped, for example, from plastics material and produced by injection-moulding. Two cable connection regions 26 are mechanically fixedly connected to the housing body 20. The housing body 20 has two attachment devices 21 in the form of holes by means of which the connector 2 can be mounted on an external attachment surface.

The connector 2 also contains a clamping device 25. The clamping device 25 and the cable connection region 26 are preferably formed in one piece from a metal blank. The clamping device 25 has three prongs 8 which run parallel to one another. The two outer prongs 8 are located further away from the housing body 20 than the middle prong 8. The prongs 8 are arranged to clamp the contact region 50 of the light-emitting diode 1 not shown in FIG. 5.

Optionally, the connector 2 has one or more mounting devices 9. The mounting devices 9 are arranged so that the clamping device 25 is movable relative to the cable connection region 26 by a mounting tool 90, for example, in the form of a screwdriver. In FIG. 5C the clamping device 25 is movable to the left by the mounting tool 90 and mounting device 9. This facilitates the mounting especially of organic light-emitting diodes 1 in accordance with FIG. 1B.

A further example of the connector 2 is shown in FIG. 6 as shown in the side view in accordance with FIG. 6A, the front view in accordance with FIG. 6B and the plan view in accordance with FIG. 6C. The one-piece connector 2 has just one cable connection region 26 directly adjoined by the clamping device 25. The clamping device 25 can be of identical construction to that described in connection with FIG. 5.

In the example of the connector 2 in accordance with FIG. 7, the clamping device 25 is C-shaped in front view as shown in FIG. 7B. Such connectors 2 are used preferably for attaching and electrically contacting light-emitting diodes 1 in accordance with FIGS. 3 and 4.

In the side views in accordance with FIGS. 6A and 7A, it can be seen that a receiving direction of the cable connection region 26 for a cable, not shown in FIGS. 6 and 7, runs from top to bottom. A plug-in direction of the clamping device 25 for mounting on the contacting device 5, not shown, runs from left to right in accordance with each of FIGS. 6A and 7A. In the case of the examples of the connector 2 in accordance with FIGS. 6 and 7, therefore, the receiving direction and the plug-in direction are in each case oriented transversely, especially perpendicularly, to one another.

By the connectors 2 in accordance with FIGS. 5 to 7 it is possible in each case to make only single-pole electrical contact with the organic light-emitting diode 1. Departing from that arrangement, it is possible for both the contacting device 5 and the connectors 2 to be arranged for multi-pole contacting. The contacting device 5 is in that case preferably formed by a curved printed circuit board. In the example in accordance with FIG. 5, the laterally located cable connection regions 26 can then each be in electrically conductive connection only with prongs 8 of the clamping device 25 that are located closer to the housing body 20 or with prongs 8 that are located further away from the housing body 20 on upper sides and lower sides of the contact region 50.

In all the examples the connectors 2 are especially formed from copper or a copper alloy. It is equally possible for other sheet metals such as sheet iron to be used, which to improve an electrical contact, can be coated with other metals, for example, Au, Cr, Pd and/or Ni.

Figure 9:
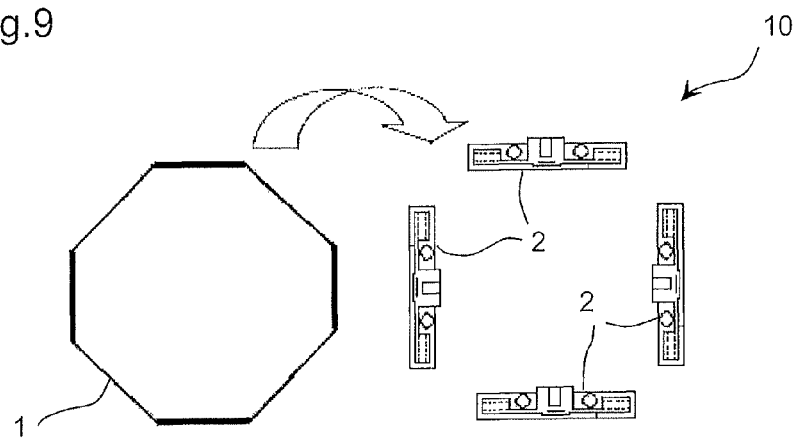
Figure 10:
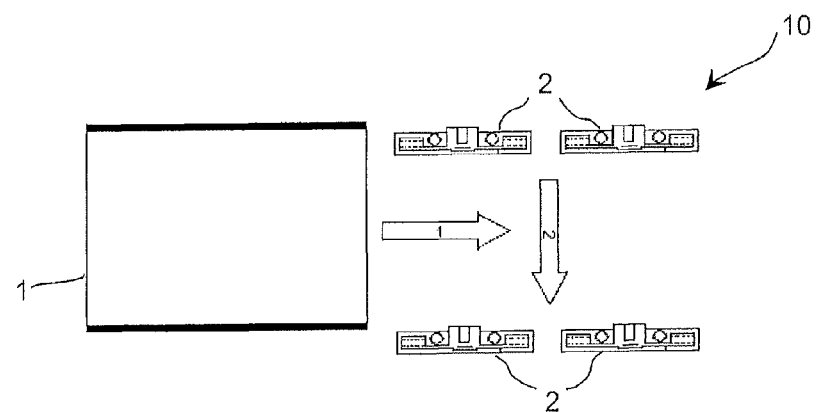

FIGS. 8 to 10 each show luminaires 10 having an organic light-emitting diode 1 and having a plurality of connectors 2, the luminaires in each case not being shown in the finished assembled state for the purpose of better clarity.

According to FIG. 8, the octagonal light-emitting diode 1, seen in plan view, is mounted on four connectors 2, for example, in accordance with FIG. 6. Electrically conductive cables 6 have been introduced into the cable connection regions 26, not shown in FIG. 8, for example, by soldering, clamping, plugging-in or crimping. It is possible for the connectors 2 to be plugged onto the light-emitting diode 1 each independently of the others.

Unlike what is shown in FIG. 8, it is also possible for the four cables 6 to be bound together. Such a luminaire 10 can then be suspended, for example, from the ceiling of a room.

In the example in accordance with FIG. 9, the light-emitting diode 1 can be electrically and mechanically attached and contacted with four connectors 2, especially in accordance with FIG. 5. The connectors 2 located at the top and bottom in FIG. 9 have the same orientation. The connectors 2 located on the left and right in FIG. 9 have anti-parallel orientation.

To simplify the illustration, the size of the connectors 2 in each of FIGS. 9 and 10 has been exaggerated. Preferably, after mounting of the light-emitting diode 1, the connectors 2 come to rest entirely behind the light-emitting diode 1 so that the connectors 2, after mounting, are no longer visible in plan view onto the carrier front face 30.

In accordance with FIG. 10, all the connectors 2 have the same orientation. The light-emitting diode 1 is in that case being guided over the connectors 2 and in FIG. 10 guided downwards, symbolized by the arrows labelled 1 and 2. Such attachment is effected, for example, to the vertical walls of a room and can be reversible. The connectors 2 have preferably already been attached to a suitable mounting surface beforehand.

The descriptions herein with reference to the examples do not limit this disclosure thereto, but, rather, my light emitting diodes, connectors and luminaires encompass any novel feature and any combination of features, including in particular any combination of features in the appended claims, even if the features or combinations are not themselves explicitly defined in the claims or examples.

The invention claimed is:

1. A luminaire comprising at least one organic light-emitting diode and a plurality of connectors, wherein the organic light-emitting diode comprises:
a carrier substrate having a carrier front face and a carrier rear face,
at least one active layer that generates electromagnetic radiation and emits the radiation at the carrier front face, the active layer being mounted on the carrier substrate,
a reflective layer located on a side of the active layer remote from the carrier substrate,
at least one contacting device on the carrier rear face that electrically contacts and simultaneously mechanically attaches the organic light-emitting diode, the contacting device comprising a contact region and, seen in a side view parallel to the carrier rear face, is elevated in a U-shape or L-shape above the carrier rear face and/or extends in a lateral direction away from the active layer; wherein the connector comprises:
at least one clamping device that clamps the contact region of the contacting device of the organic light-emitting diode, and
at least one cable connection region that mounts an electrically conductive cable on the connector; wherein:
the light-emitting diode is electrically contacted and mechanically attached only by the connectors,
the connectors are not visible in plan view onto the carrier front face,
the contacting device, seen in plan view onto the carrier front face, is entirely covered by the carrier substrate and is not visible from the carrier front face, and
the contacting device, at least in some locations seen from the carrier rear face, covers the active layer so that the active layer is located in some locations between the contacting device and the carrier substrate.

2. The luminaire according to claim 1, wherein the contacting device and/or the contact region is formed mirror-symmetrically with respect to a plane perpendicular to the carrier rear face and, seen in plan view onto the carrier front face, is located next to the active layer.

3. The luminaire according to claim 1, wherein an intermediate space is located between the contact region and the carrier rear face, which intermediate space is freely accessible from a nearest carrier end face of the carrier substrate.

4. The luminaire according to claim 1, wherein the contacting device is made from a metal strip or from a printed circuit board and the contact region is formed by bending the metal strip or the printed circuit board.

5. The luminaire according to claim 1, wherein the connectors are all of identical construction and are differently spatially oriented and aligned with respect to one another.

6. The luminaire according to claim 1, wherein the contacting device has just one electrical contact pole.

7. The luminaire according to claim 1, wherein a length of the contacting device is 10 mm to 300 mm, a width of the contacting device is 2 mm to 35 mm, the contacting device has a height of 0.5 mm to 10 mm, and a thickness of a material from which the contacting device is made is 0.2 mm to 2 mm.

8. The luminaire according to claim 1, which contains one of the following numbers of contacting devices: 1, 2, 3, 4, 5, 6, 8, 10.

9. The luminaire according to claim 1, wherein the clamping device is plugged onto the contact region of the contacting device,
a receiving direction of the cable connection region for the cable is oriented transversely with respect to a plug-in direction of the clamping device, and
the connector is a one-piece metal part.

10. The luminaire according to claim 1, wherein the clamping device has a fork-like shape and has at least three prongs, and
the prongs are arranged to touch the contact region of the clamping device on at least two mutually opposite sides.

11. The luminaire according to claim 1, wherein the clamping device is mounted to be tiltable and/or displaceable relative to the cable connection region, and the clamping device and the cable connection region are of one-piece construction.

12. A luminaire comprising at least one organic light-emitting diode and a plurality of connectors, wherein the organic light-emitting diode comprises:
- a carrier substrate having a carrier front face and having a carrier rear face,
- at least one active layer that generates electromagnetic radiation and emits the radiation at the carrier front face, the active layer being mounted on the carrier substrate,
- at least one contacting device on the carrier rear face that electrically contacts and simultaneously mechanically attaches the organic light-emitting diode, the contacting device comprising a contact region and, seen in a side view parallel to the carrier rear face, is elevated in a U-shape or L-shape above the carrier rear face and/or extends in a lateral direction away from the active layer;

wherein the connector comprises:
- at least one clamping device that clamps the contact region of the contacting device of the organic light-emitting diode, and
- at least one cable connection region that mounts an electrically conductive cable on the connector; wherein the light-emitting diode is electrically contacted and mechanically attached by the connectors.

* * * * *